INVENTORS
SEISHI YAMAZAKI and MASAO KANEDA

BY
Craig, Antonelli, Stewart & Hill
ATTORNEYS

INVENTORS

SEISHI YAMAZAKI and MASAO KANEDA

BY Craig, Antonelli, Stewart & Hill
ATTORNEYS

AUTOMATIC GAIN CONTROLLING CIRCUIT

Filed May 14, 1969 3 Sheets-Sheet 3

INVENTORS

SEISHI YAMAZAKI and MASAO KANEDA

BY Craig, Antonelli, Stewart & Hill

ATTORNEYS 3,551,834

AUTOMATIC GAIN CONTROLLING CIRCUIT

Seishi Yamazaki and Masao Kaneda, Katsuta-shi, Japan, assignors to Hitachi, Ltd., Tokyo, Japan, a corporation of Japan Filed May 14, 1969, Ser. No. 824,621
Claims priority, application Japan, May 15, 1968, 43/32,209
Int. Cl. H03g 3/30
U.S. Cl. 330—29 7 Claims

ABSTRACT OF THE DISCLOSURE

In an automatic gain controlling circuit, comprising a first transistor adapted to amplify an input signal, a second transistor adapted to amplify the output of said first transistor, and first, second and third resistors connected in series with a power source, said third resistor being grounded at one end thereof, the connection point between the second and third resistors being connected with the base of said first transistor, wherein a diode is inserted in such a direction as to permit current flow from the connection point between the first and second resistors to the collector of the output transistor, and said diode is so adapted as to be rendered conductive only when the input exceeds a predetermined level.

BACKGROUND OF THE INVENTION

Field of the invention

This invention relates to an automatic gain controlling circuit for a transistor amplifier, and more particularly it pertains to a delayed automatic gain control circuit which can be most effectively used as an output amplified stage in a modulator-amplifier of a small-sized transistorized receiver-transmitter, recording-reproducing amplifier of a tape recorder or the like.

A circuit of this type should be designed so that when an input is lower than a certain level, no automatic gain controlling action is produced to achieve a linear relationship between the input and the output and when the input goes above said certain level, the automatic gain controlling action is produced to maintain the output constant irrespective of the input. This is referred to as delayed automatic gain controlling action.

Description of the prior art

With such a conventional circuit as shown in FIG. 1, however, it is impossible to produce such delayed automatic gain controlling action.

In the FIG. 1 circuit, an input signal is imparted through a capacitor 2 to the base *1b* of a first stage gain-controllable amplifying transistor 1 the output of which is in turn supplied to transistors 4 and 5 constituting a well-known output push-pull stage through a transformer 3, so that an output signal is obtained across a secondary coil 7 of an output transformer 6. Applied to the base *1b* of the transistor 1 is a bias voltage obtained at a connection point of a series divider circuit consisting of resistors 9 and 10 and diode 12 by dividing the voltage across power source terminals 18 and 18'. Further, a resistor 16 and diode 11 are inserted in such a direction as shown in the drawing between the connection point 15 between the resistor 10 and the diode 12 and one end 8 of the secondary coil of the output transformer 6, a capacitor 17 is connected between the connection point and ground, and a capacitor 13 is inserted between the anode of the diode 11 and ground.

In the foregoing circuit arrangement, where there is no input signal, a forward current is supplied to the diodes 11 and 12 through the divider resistors 9 and 10, and the anode potentials of the diodes 11 and 12 are imparted to the capacitors 13 and 17, respectively.

In such a state, if an A.C. input signal is supplied to the base *1b* of the transistor 1, then a current rectified by the diode 11 is caused to flow through the diode 12 in the reverse direction only when a negative half cycle of the A.C. ouput signal appears at the output terminal 8, so that the internal resistance of the diode 12 is varied in accordance with the amplitude of the input signal.

Assume that conventional diodes 1N34 are used as the diodes 11 and 12 of this circuit, for example. Then, the collector current of the transistor 1 begins decreasing as shown by the curve *a* of FIG. 3 when the output signal $E_f$ exceeds 0.04 v., and it is cut off when $E_f$ becomes 1.2 v.

By such operation, this circuit is able to produce an automatic gain controlling action even when the input is relatively low as shown by the curve *a* of FIG. 4 illustrating the input-output characteristic, so that the linear relationship between the input and the ouput is lost with a result that the distortion factor is gradually increased when the input is still low, as will be seen from the curve *a'*. Furthermore, since a gain controlling action is imparted to the transistor 1 even when the input signal is still small, the maximum output cannot be obtained unless a considerably great input signal is imparted thereto, as will be seen from the curve *a* of FIG. 4.

The resistor 16 and capacitor 17 are provided for the purpose of removing the ripple component occurring in a control current after it has been rectified by the diode 11, but the provision of these parts constitutes such a drawback that the operational time constant cannot be made small.

SUMMARY OF THE INVENTION

It is an object of the present invention to provide a delayed automatic gain control circuit which is free from the drawbacks of the aforementioned conventional circuit.

Another object of the present invention is to provide a delayed automatic gain control circuit which is so designed that at the normal operating level, distortion can be minimized and yet the operational time constant can be reduced and easily selected.

In accordance with the present invention, there is provided a gain-controllable transistor for amplifying an input signal applied thereto, a pair of output transistors connected together to form a push-pull output circuit and coupled with a gain-controllable transistor for amplifying an output signal of the gain-controllable transistor, biasing means for supplying an operating base bias voltage to the gain-controllable transistor and generating a reference voltage whose variation is followed by the variation of the base bias voltage, and a diode inserted between said biasing means and one of collectors of the pairs output transistors so that the diode is supplied with a difference voltage between the reference voltage and the collector potential of said one of the output transistors. The reference voltage is so selected to be equal to the collector potential when the input signal applied to the gain-controllable transistor has a predetermined large amplitude which can cause the output circuit to produce a relatively large output. The diode is then directed in such a direction that it is rendered conductive only when the amplitude of the input signal exceeds the predetermined amplitude.

Other objects, features and advantages of the present invention will become apparent from the accompanying drawings.

DESCRIPTION OF THE PREFERRED EMBODIMENTS

The present invention will now be described with respect to one embodiment thereof shown in FIG. 2.

Figure 1:
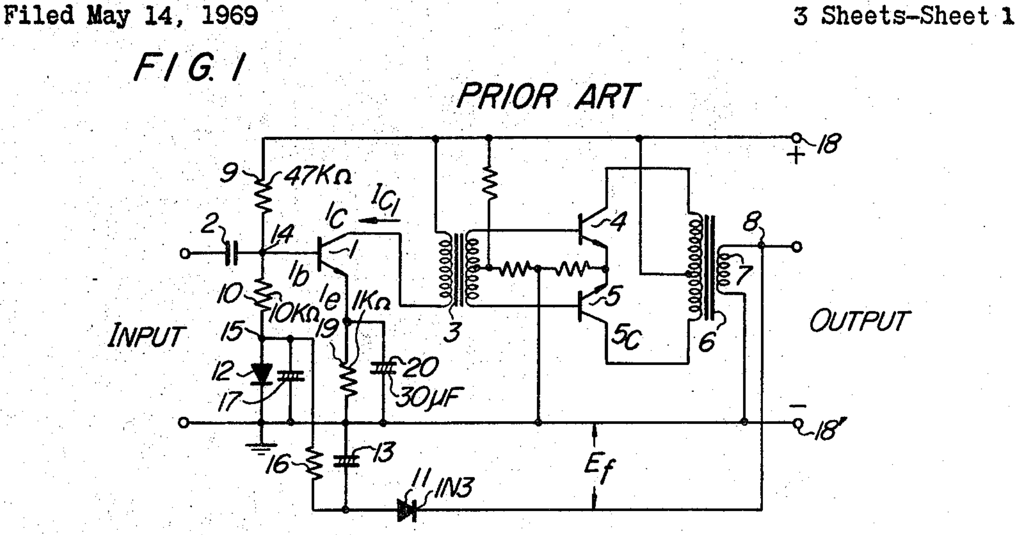
FIG. 1 PRIOR ART
FIG. 1 is a circuit diagram showing an example of the conventional automatic gain control circuit.
Figure 2:
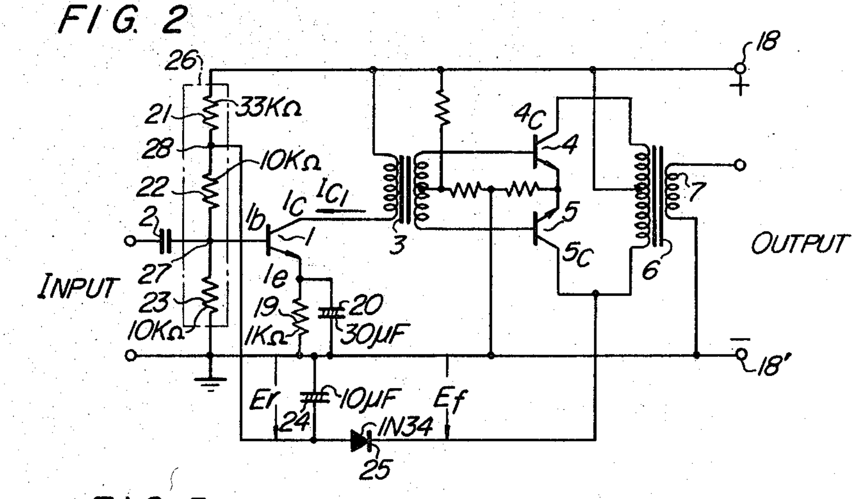
FIG. 2 is a circuit diagram showing the automatic gain control circuit according to an embodiment of the present invention.

Parts of FIG. 2 corresponding to those of FIG. 1 are indicated by the same numerals. An input signal is supplied to the base 1*b* of a gain-controllable transistor 1 through a capacitor 2. The base 1*b* is connected with the connection point 27 between resistors 22 and 23 which are connected across power source terminals 18, 18' in series with a resistor 21 to thereby constitute a biasing circuit 26.

The transistor 1 has its emitter 1*e* grounded through a parallel circuit of a resistor 19 and capacitor 20 and its collector 1*c* connected with a coupling transformer 3.

Connected with the secondary side of the transformer 3 are output transistors 4 and 5 to constitute a well-known push-pull circuit. The transistors 4 and 5 have the collectors 4*c* and 5*c* thereof connected with an output transformer 6.

In the present embodiment, a diode 25 is inserted between the connection point 28 between the bias resistors 21 and 22 and the collector 5*c* of the transistor 5, with the cathode of the diode coupled to the collector of the transistor 5. A capacitor 24 is connected between the anode of the diode 25 and the ground.

The push-pull amplifier of the present embodiment is adapted to operate in Class C, so that the collector potentials of the output transistors are varied in correspondence to the waveform of an input signal, with the power source voltage as the reference level. That is, they are changed from the two times higher potential of the power source voltage to zero at the maximum amplitude of the input signal.

Thus, the values for the resistors constituting the biasing circuit are suitably selected so that the potential at the connection point 28 between the resistors 21 and 22 may become equal to the minimum potential at the collector 5*c* of the transistor 5 when the input signal of a predetermined amplitude is applied.

With the foregoing arrangement, when the amplitude of an input signal is smaller than the aforementioned predetermined level, the collector potential $E_f$ of the output transistor 5 never swings low enough to reach the level of the potential $E_r$ at the connection point 28 so that the diode 25 is maintained in the nonconducting state. In this case, therefore, a linear relationship is maintained between the input and the output because no automatic gain controlling action is produced. At this point, the capacitor 24 is charged with the potential $E_r$.

When the input signal goes above the aforementioned predetermined level, there occurs a period during which the potential $E_f$ at the collector 5*c* swings lower than the potential $E_r$ at the connection point 28. Thus, the diode 25 is rendered conductive only during that period, and the potential $E_r$ follows the potential $E_f$. Consequently, the base bias potential of the transistor 1 depends upon the potential $E_r$. That is, it becomes a function of the potential $E_f$. Thus, the greater the input signal becomes, the lower the base bias potential will be. In this way, an automatic gain controlling action is produced.

Figure 3:
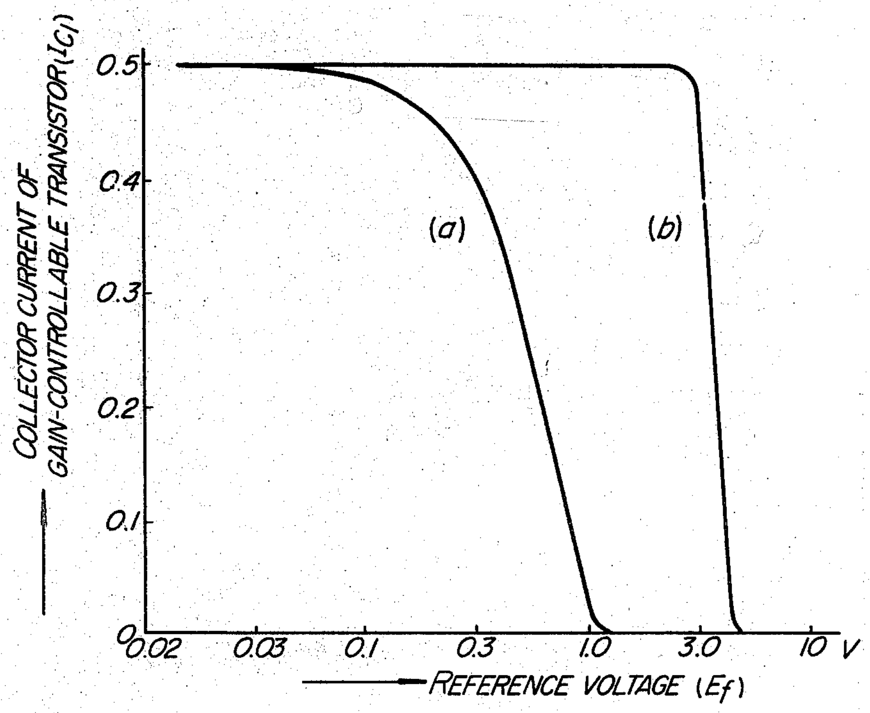
FIG. 3 is a view useful for comparing the automatic controlling characteristics of the circuits shown in FIGS. 1 and 2.

For example, if 1N34 is used as the diode 25, a voltage of 6 v. is applied across the power source terminals 18 and 18', and resistance values of 33 KΩ, 10 KΩ and 10 KΩ are provided for the resistors 21, 22 and 23 as shown in FIG. 2 respectively in the circuit according to the present embodiment, then the output signal $E_f$ has no effect on the collector current of the transistor 1 so that the latter remains unchanged until the output signal $E_f$ exceeds about 2.2 v., as shown by a curve *b* of FIG. 3. If the output signal $E_f$ goes above 2.2 v., then the collector current begins decreasing, and if the output signal arrives at about 4.6 v., then the collector current is cut off.

Figure 4:
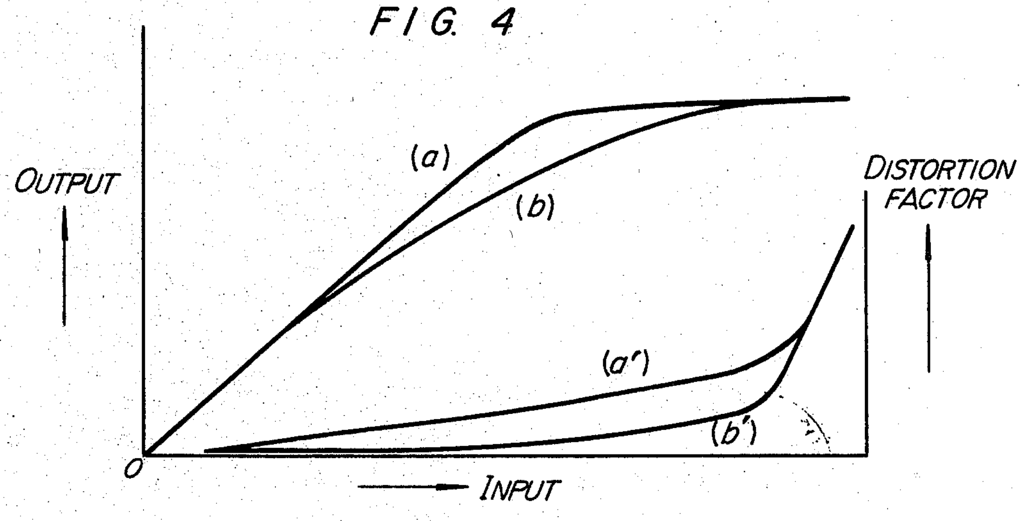
FIG. 4 is a view useful for comparing the output and distortion factor characteristics of the circuits shown in FIGS. 1 and 2.

In operation, when the input is lower than a predetermined level, a linear relationship is maintained between the input and the output as shown by the curve *b* in FIG. 4 so that no automatic gain controlling action is produced, while when the input goes above said predetermined level, an automatic gain controlling action is produced so that the relationship between the input and the distortion factor becomes as shown by the curve *b'* from which it will be seen that the distortion factor is low when the input is relatively small. Thus, the input versus distortion factor characteristic is improved over that of the conventional circuit which is represented by the curve *a'*.

Furthermore, since the collector potential at the collector 5*c* of the transistor 5 swings from a potential twice the potential of the power source voltage to zero with the power source voltage as the reference level at the maximum amplitude of the input signal, since the reference potential or signal $E_r$ at the connection point 28 is divided from the power source voltage by means of the resistors 21, 22 and 23, and since the reference potential $E_r$ is determined to exceed to the minimum collector potential at the collector 5*c* only when the input signal in excess of the aforementioned predetermined level is imparted to the gain-controllable transistor, the conduction angle of the diode is always smaller than 180° no matter what level the reference potential is selected, although the conduction angle can be changed by suitably changing the bias resistors 21, 22 and 23.

Ripple component is divided by the resistors 22 and 23 and then imparted to the base 1*b* of the transistor 1, so that the amount of feedback is reduced. Thus, there is provided a small operational time constant which is defined by the capacitor 24 and the forward resistance of the diode 25.

In the circuit according to the present embodiment, the anode of the diode 25 is connected with the connection point between the bias resistors 21 and 22 for the purpose of preventing any input signal from being short-circuited in A.C. sense through the capacitor 24. However, the present invention is by no means limited to such circuit arrangement in so far as care is taken to achieve the aforementioned purpose.

Figure 5:
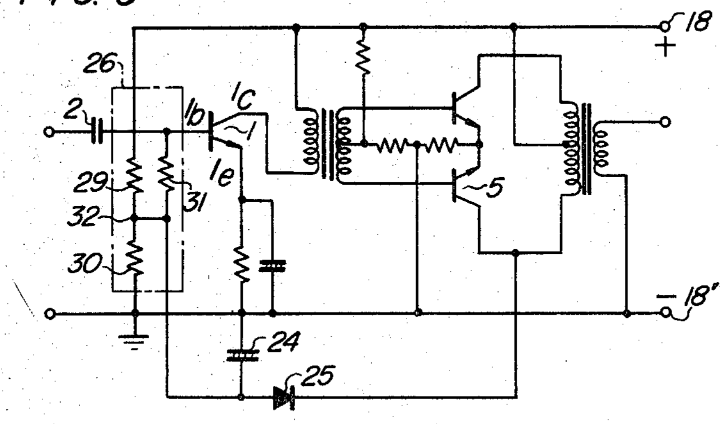
FIGS. 5 to 9 are circuit diagrams showing the automatic gain control circuits according to other embodiments of the present invention.

A modified form of the biasing circuit 26 of FIG. 2 is shown in FIG. 5 wherein resistors 29 and 30 connected in series with each other are connected across the power source terminals 18 and 18' and a resistor 31 is inserted between the connection point 32 between the resistors 29 and 30 and the base 1*b* of the transistor 1.

With such circuit arrangement, it is possible to prevent the short-circuiting of an input signal in A.C. sense by means of the resistor 31.

Figure 6:
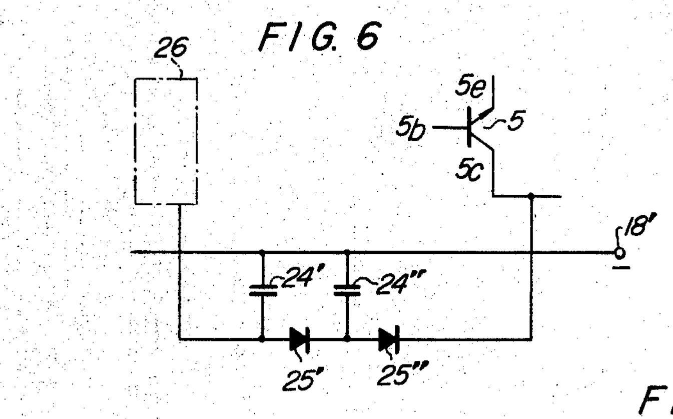

Furthermore, it is possible to further reduce a ripple component stemming from rectification by providing two stages of series-parallel rectifier circuits consisting of diode 25 and capacitor 24 incorporated in the FIG. 2 circuit, as shown in FIG. 6, wherein the cathode of a diode 25' is connected with the anode of a diode 25'', the anode of the diode 25' is connected with the biasing circuit 26, the cathode of the diode 25'' is connected with the collector 5c of the output transistor 5, and capacitors 24' and 24'' are inserted between the anodes of these diodes and the ground respectively.

Figures 7, 8:
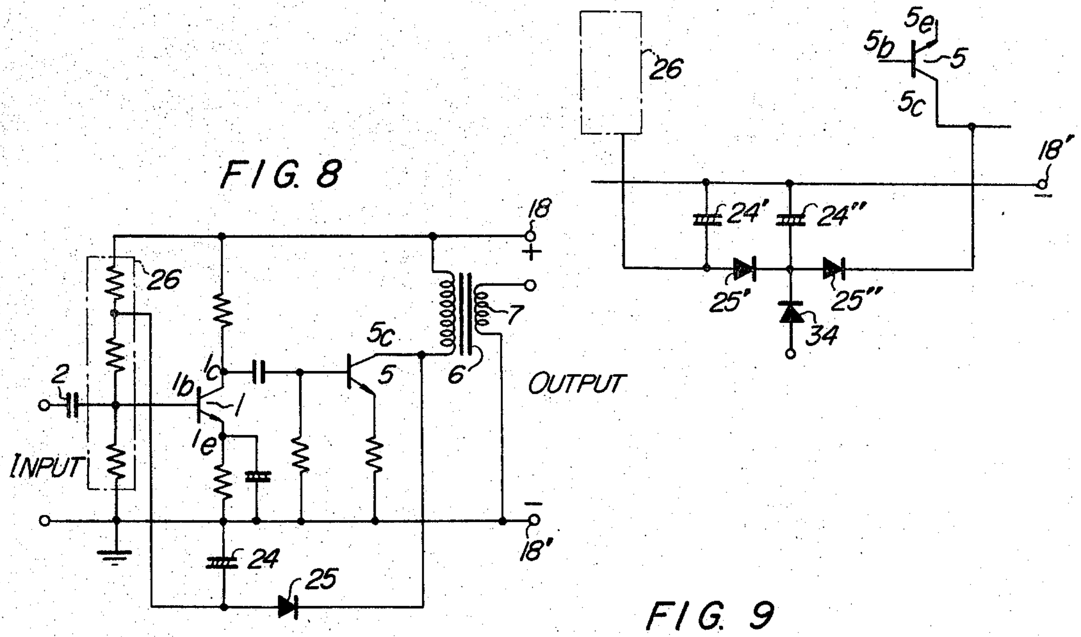

In an attempt to impart an automatic gain controlling action to an amplifier only during the recording operation as in a tape recorder in which the recording and reproducing operations are switchingly performed, a control potential higher than the anode potential of the diode 25' may be imparted only during the reproducing operation to the anode of a diode 34 having the cathode thereof connected with the connection point 33 between the diodes 25' and 25'' of the FIG. 6 circuit, as shown in FIG. 7.

Although, in the foregoing, description has been made of a circuit wherein the gain of a preamplifier stage for energizing a low frequency push-pull output stage is automatically controlled in accordance with the collector potential of said output stage, it will be readily apparent to those skilled in the art that the present invention can equally be applied to a single output stage circuit arrangement.

Referring to FIG. 8, there is shown an example of such circuit arrangement wherein the cathode of the diode 25 having the anode thereof connected with the biasing circuit is connected with the collector 35c of a single output transistor 35. In this circuit arrangement, the collector potential of the transistor 35 is varied about a predetermined level lower than the power source potential, and the variation width is varied in accordance with an input signal. Therefore, the biasing circuit is suitably set up so that the potential applied to the anode of the diode 25 may assume a value which is within said variation width and lower than the aforementioned collector potential.

It is to be understood that the present invention is not limited to low frequency applications, but it can equally be applied to high frequency applications.

Figure 9:
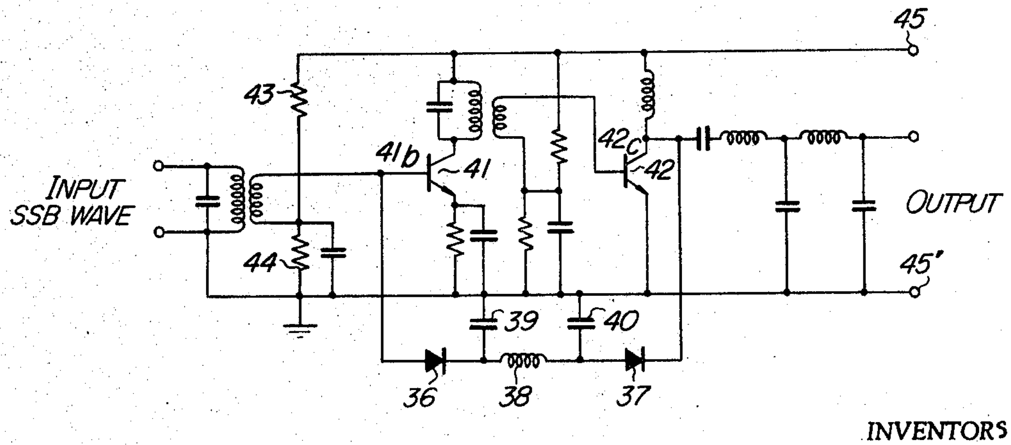

Referring to FIG. 9, there is shown a circuit in which the present invention is applied to the high frequency stage of a single side band receiver-transmitter for example.

Description of the conventional circuit arrangement will be omitted, and only those portions which embody the present invention will be described. In FIG. 9, numeral 36 represents a diode having the anode thereof connected with the base 41b of a high frequency amplifier transistor 41, the cathode of the diode being connected with the anode of a diode 37 through a high frequency choke coil 38. The diode 37 has its cathode connected with the collector 42c of a second high frequency amplifier stage transistor 42.

Numerals 39 and 40 denote rectifying capacitors which are connected at one end with the opposite ends of the choke coil 38 respectively and grounded at the other end.

The voltage available across power source terminals 45 and 45' is divided by means of resistors 43 and 44 and then imparted to the base 41b of the transistor 41. By making the base potential of the transistor 41 equal to the potential which is applied to the collector 42c of the transistor 42 when an input single side band signal assumes a predetermined level, it is possible to render the diodes 36 and 37 conductive when the input goes above the afore-mentioned predetermined level. Thus, a delayed automatic gain controlling action can be produced.

What is claimed is:

1. An automatic gain control circuit comprising:

a first transistor having an emitter, a base and a collector for operatingly amplifying an input signal supplied to the base thereof;

a second transistor arrangement formed by a pair of transistors each having an emitter, a base and a collector and connected in push-pull provided in a later stage from said first transistor for operatingly amplifying an output signal obtained from said first transistor;

bias means connected to the base of said first transistor for operatingly generating a reference voltage and an operating bias voltage, said reference voltage being equal to the collector potential of said second transistor arrangement when the input signal to said first transistor has a predetermined large amplitude, and said bais voltage being variable in response to the variation in said reference voltage and supplied to the base of said first transistor;

first and second diodes each having an anode and a cathode, the anode of said first diode being connected to said bias means to be supplied with said reference voltage, the cathode of said first diode and the anode of said second diode being connected to each other, and the cathode of said second diode being connected to the collector of one of the transistors of said second transistor arrangement to be supplied with the collector potential which oppositely varies in response to the variation in the input signal amplitude; and first and second capacitors, one of the terminals of said capacitors being connected to the anodes of the first and second diodes, respectively and the other terminals of the capacitors being grounded;

said diodes being rendered conductive when the input signal amplitude become greater than the predetermined large amplitude, so that the reference voltage is reduced to said collector potential of said second transistor arrangement, whereby the gain of the first transistor is reduced when the diodes are in their conductive states.

2. An automatic gain control circuit as defined in claim 1, wherein said bias means comprises first, second and third resistors serially connected to a source of an operating voltage, the junction between the first and the second resistors being connected to the anode of said diode, the junction between the second and the third resistors being connected to the base of said first transistor and the remaining terminal of the third resistor being grounded.

3. An automatic gain control circuit as defined in claim 1, wherein said bias means comprises first and second resistors connected in series to a source of an operation voltage, so that the operation voltage is divided at the junction between said first and second resistors and serves as the reference voltage, and a third resistor connected between the base of the first transistor and the junction between said first and the second resistors.

4. An automatic gain control circuit comprising:

a gain-controllable transistor for amplifying an input signal applied thereto;

a pair of output transistors connected to form a push-pull circuit and operatively coupled to said gain-controllable transistor for amplifying an output signal obtained from said gain-controllable transistor;

a power source coupled with said gain-controllable transistor and said output transistor;

biasing means connected to said power source for generating a reference voltage and for supplying to said gain-controllable transistor an operating base bias voltage which is varied in response to variation of the reference voltage;

a diode connected between a collector of one of said pair output transistors and said biasing means in such a manner that said diode is supplied with a difference voltage between the reference voltage and the collector potential of said one of the output transistors and is rendered unidirectionally conductive only when the input signal exceeds a predetermined large amplitude which can cause the output transistors to produce a relatively large output; and smoothing means coupled with said diode for smoothing a current flowing through said diode when conductive and for decreasing the reference voltage, thereby restricting the gain of said gain-controllable transistor only when the input signal exceeds said predetermined amplitude.

5. An automatic gain control circuit as defined in claim 4 wherein said gain-controllable transistor and said pair of output transistors are of a n–p–n type, respectively, and said biasing means comprises first, second and third resistors serially connected to said power source, the connection between the first and the second resistors being connected to the anode of said diode, and the connection between the second and the third resistors being connected to the base of the gain-controllable transistor.

6. An automatic gain control circuit as defined in claim 4, wherein said gain-controllable transistor and said pair of output transistors are of a n–p–n type, respectively, and said biasing means comprises first and second resistors serially connected to the power source and a third resistor connected at one end thereof to the base of the gain-controllable transistor and at the other end thereof to the connection between said first and said second resistors, the anode of said diode being connected to the connection point of the first, second and third resistors.

7. An automatic gain control circuit as defined in claim 4, wherein said smoothing means comprises a second diode connected between said first mentioned diode and said biasing means, and first and second capacitors connected at one end thereof to the anode and the cathode of the second diode, respectively, and each grounded at the other end thereof.

References Cited

UNITED STATES PATENTS 3,272,915 9/1966 Theriault ---------- 325—319

FOREIGN PATENTS 663,563 5/1963 Canada ------------ 325—410

OTHER REFERENCES

G.E. Transistor Manual, 1964, 7th edition, p. 103.

ROY LAKE, Primary Examiner

J. B. MULLINS, Assistant Examiner

U.S. Cl. X.R.

330—138